(12) United States Patent
Shih et al.

(10) Patent No.: US 6,232,160 B1
(45) Date of Patent: May 15, 2001

(54) METHOD OF DELTA-CHANNEL IN DEEP SUB-MICRON PROCESS

(75) Inventors: Jiaw-Ren Shih; Shui-Hung Chen; Jian-Hsing Lee, all of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/396,515

(22) Filed: Sep. 15, 1999

(51) Int. Cl.$^7$ ................... H01L 21/336; H01L 21/8234
(52) U.S. Cl. ................. 438/197; 438/305; 438/291; 438/231
(58) Field of Search ................... 438/197, 574, 438/180–185, 229–232, 291, 299–307, 595, 157, 161–164

(56) References Cited

U.S. PATENT DOCUMENTS

| | | | |
|---|---|---|---|
| 5,429,956 | 7/1995 | Shell et al. | 437/29 |
| 5,434,093 | 7/1995 | Chau et al. | 437/41 |
| 5,538,913 | 7/1996 | Hong | 437/44 |
| 5,677,218 | 10/1997 | Tseng | 437/45 |
| 5,686,321 | * 11/1997 | Ko et al. | 438/289 |
| 5,698,461 | * 12/1997 | Liu | 438/291 |
| 5,712,501 | * 1/1998 | Davies et al. | 257/335 |
| 5,712,503 | * 1/1998 | Kim et al. | 257/345 |
| 5,766,998 | * 6/1998 | Tseng | 438/291 |

* cited by examiner

*Primary Examiner*—Charles Bowers
*Assistant Examiner*—Thanh Nguyen
(74) *Attorney, Agent, or Firm*—George O. Saile; Stephen B. Ackerman; Rosemary L. S. Pike (57) ABSTRACT

A new method of suppressing short channel effect without increasing junction leakage and capacitance using a single self-aligning delta-channel implant is described. A pad oxide layer is formed over a semiconductor substrate. A silicon nitride layer is deposited overlying the pad oxide layer and patterned to leave an opening where a gate electrode will be formed. Dielectric spacers are formed on the sidewalls of the opening wherein a portion of the substrate is not covered by the spacers within the opening. A single delta-channel implant is made into the semiconductor substrate using the silicon nitride layer and the dielectric spacers as a mask. This delta-channel implant suppresses short channel effect without increasing junction leakage and capacitance. The dielectric spacers are removed. A polysilicon layer is deposited over the silicon nitride layer and within the opening and polished to leave the polysilicon layer only within the opening. The silicon nitride layer is removed to form a gate electrode wherein the delta-channel implant underlies the gate electrode. Thereafter, lightly doped regions and source and drain regions are formed within the semiconductor substrate associated with the gate electrode to complete fabrication of the integrated circuit device.

22 Claims, 8 Drawing Sheets

METHOD OF DELTA-CHANNEL IN DEEP
SUB-MICRON PROCESS

BACKGROUND OF THE INVENTION

1. Field of the Invention

The invention relates to the fabrication of integrated circuit devices, and more particularly, to a method of replacing an anti-punch through implant and a pocket implant with a single delta-channel implant in the fabrication of integrated circuits.

2. Description of the Prior Art

In scaling down semiconductor devices to the deep sub-micron regime, higher doped channels are required for short channel devices. Normally, an anti-punch through implant and a large angle pocket implant are made into the channel region before gate oxidation. The anti-punch through implant inhibits source/drain leakage and the pocket implant suppresses drain induced barrier lowering (DIBL) of the anti-punch through implant. However, the increased channel doping will also increase junction capacitance, junction leakage, and reverse short-channel effect. It is desired to suppress short-channel effect without increasing junction capacitance and leakage.

A number of U.S. Patents teach various methods of LDD and anti-punch through implants. U.S. Pat. No. 5,766,998 to Tseng discloses a polysilicon masking layer with spacers and two ion implants—for punch through and threshold voltage adjustment. U.S. Pat. No. 5,538,913 to Hong teaches an anti-punch through implant masked by conducting spacers which become part of the gate. U.S. Pat. No. 5,434,093 to Chau teaches an anti-punch through implant using oxide spacers as a mask. The oxide spacers remain. U.S. Pat. No. 5,698,461 to Liu also teaches an anti-punch through implant. U.S. Pat. No. 5,429,956 to Shell et al teaches an anti-punch through implant through polysilicon narrowed by oxide spacers. U.S. Pat. No. 5, 677,218 to Tseng shows an ion implant through a mask and polysilicon layer.

SUMMARY OF THE INVENTION

A principal object of the present invention is to provide an effective and very manufacturable method of suppressing short channel effect without increasing junction leakage and capacitance.

Yet another object is to provide a method of self-aligning anti-punch through implant without an additional mask.

A further object of the invention is to provide a method of replacing an anti-punch through implant and a pocket implant with a single delta-channel implant.

A still further object is to provide a method of suppressing short-channel effect without increasing junction leakage and capacitance using a single delta-channel implant.

Yet another object is to provide a method of suppressing short-channel effect without increasing junction leakage and capacitance using a single self-aligning delta-channel implant.

In accordance with the objects of this invention, a method of suppressing short-channel effect without increasing junction leakage and capacitance using a single self-aligning delta-channel implant is achieved. A pad oxide layer is formed over a semiconductor substrate. A silicon nitride layer is deposited overlying the pad oxide layer and patterned to leave an opening where a gate electrode will be formed. Dielectric spacers are formed on the sidewalls of the opening wherein a portion of the substrate is not covered by the spacers within the opening. A single delta-channel implant is made into the semiconductor substrate using the silicon nitride layer and the dielectric spacers as a mask. This delta-channel implant suppresses short-channel effect without increasing junction leakage and capacitance. The dielectric spacers are removed. A polysilicon layer is deposited over the silicon nitride layer and within the opening and polished to leave the polysilicon layer only within the opening. The silicon nitride layer is removed to form a gate electrode wherein the delta-channel implant underlies the gate electrode. Thereafter, lightly doped regions and source and drain regions are formed within the semiconductor substrate associated with the gate electrode to complete fabrication of the integrated circuit device.

BRIEF DESCRIPTION OF THE DRAWINGS

In the accompanying drawings forming a material part of this description, there is shown.

DESCRIPTION OF THE PREFERRED
EMBODIMENTS

Figure 1:
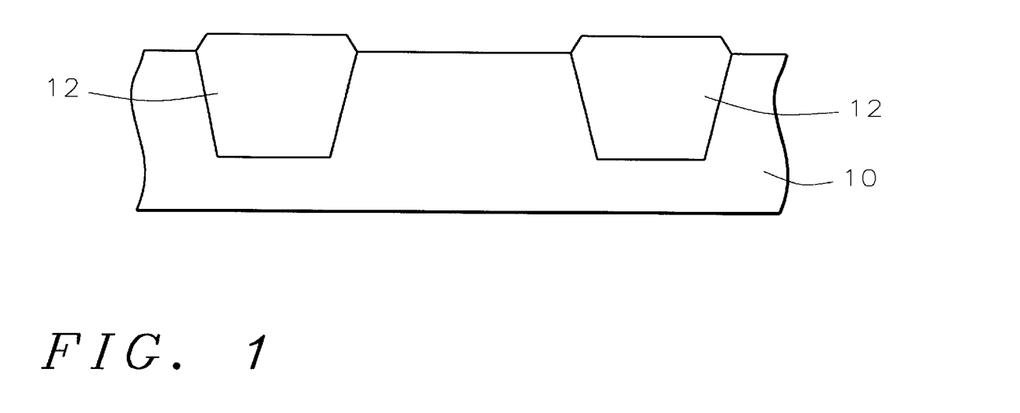
FIGS. 1 through 14 schematically illustrate in cross-sectional representation a preferred embodiment of the present invention.

Referring now more particularly to FIG. 1, there is shown an illustration of a partially completed metal oxide field effect transistor (MOSFET). The semiconductor substrate 10 is preferably composed of silicon having a (100) crystallographic orientation. Active areas of the device are separated by isolation areas, such as shallow trench isolation regions 12.

Figure 2:
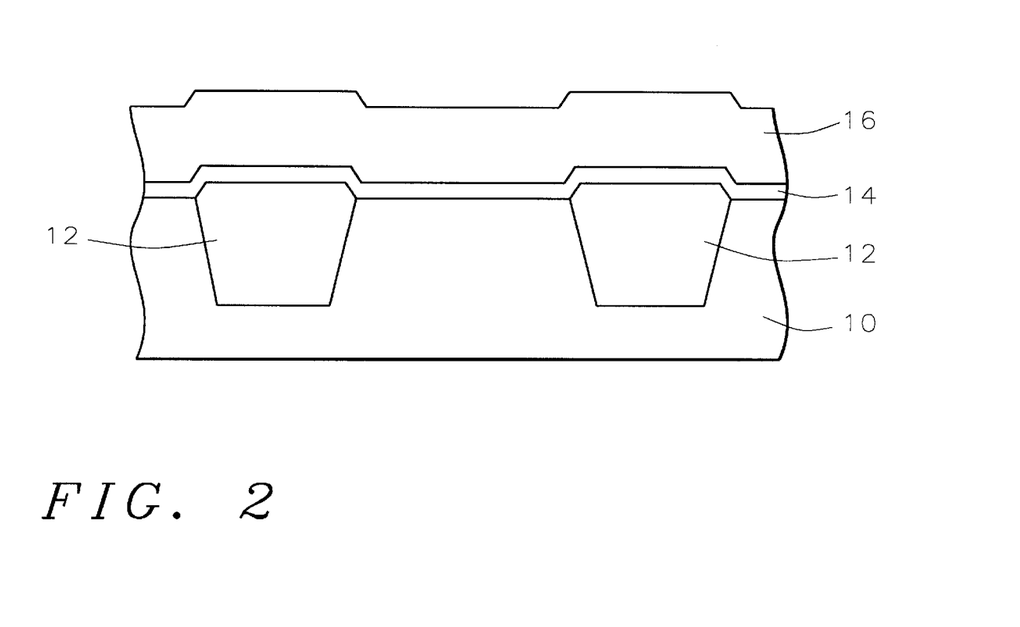

Referring now to FIG. 2, the surface of the silicon substrate 10 is thermally oxidized to form a pad oxide layer 14. A silicon nitride layer 16 is deposited over the pad oxide layer.

Figure 3:
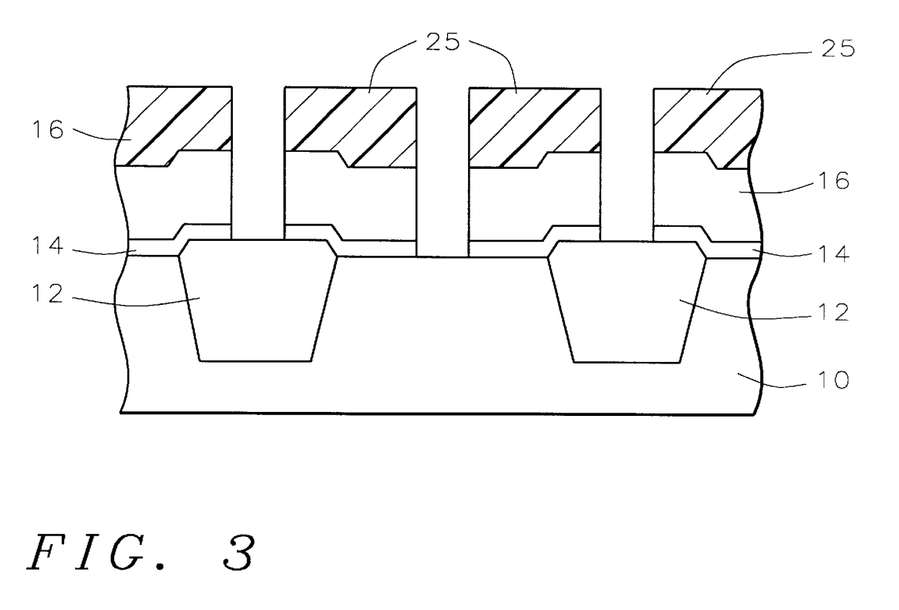

A layer of photoresist is coated over the silicon nitride layer 16 and patterned to form a photoresist mask 25, as shown in FIG. 3. This forms the self-aligning gate pattern. The silicon nitride and pad oxide layers are etched through where they are not covered by the photoresist mask.

Figure 4:
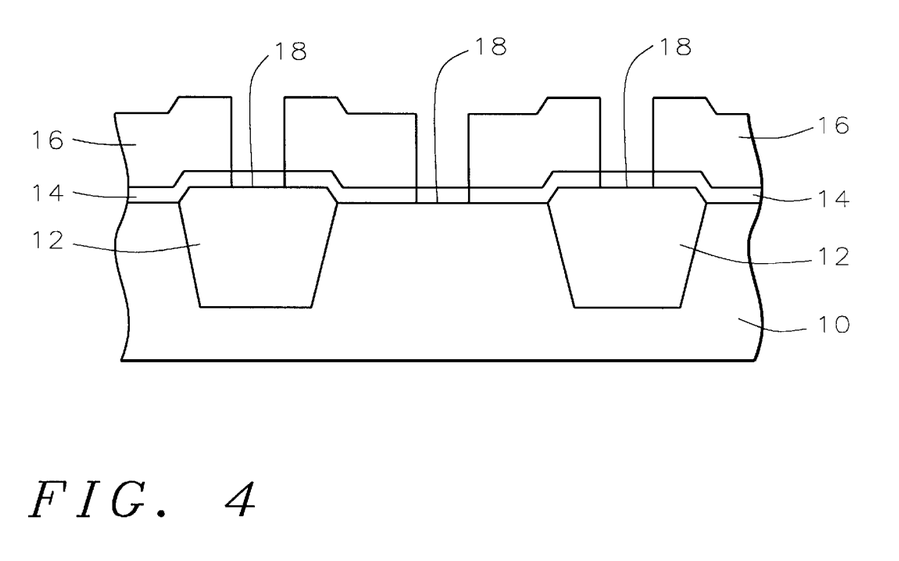

The photoresist mask is stripped and gate oxidation is formed 18 within the openings in the silicon nitride layer, as shown in FIG. 4.

Figure 5:
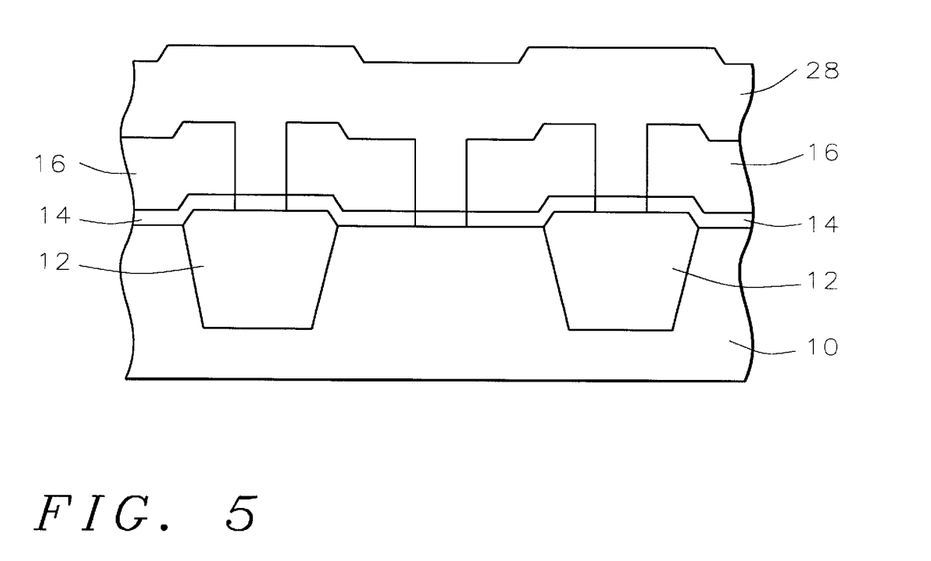

Referring now to FIG. 5, a layer of oxide 28 is deposited over the patterned silicon nitride layer. This may be silicon oxide, ozone-tetraethoxysilane (TEOS) oxide, or plasma-enhanced chemically vapor deposited (PECVD) oxide having a thickness of between about 7000 and 12,000 Angstroms. It is important to control the thickness of the spacer oxide. Ozone-TEOS oxide is preferred because of its good conformal coverage. Conformal oxide deposition and control of the deposition time is required in order to form the desired width of the delta-channel implant. For example, a deposition time of 1000–2000 Angstroms per minute may be used. The spacer oxide 28 may be planarized, for example, using chemical mechanical polishing (CMP).

Figure 6:
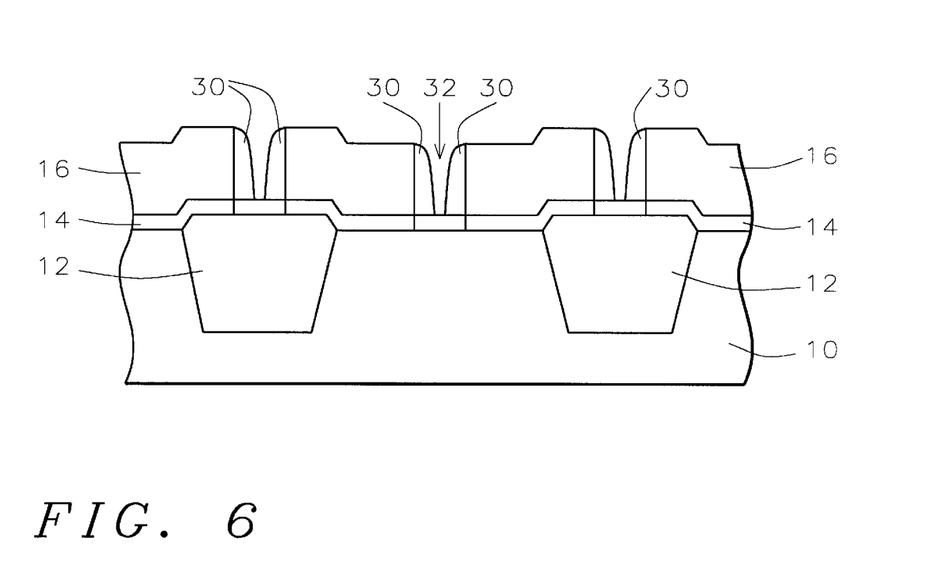

The spacer oxide 28 is anisotropically etched to leave spacers 30 within the openings in the silicon nitride layer, as shown in FIG. 6. The sidewall spacer width is very controllable using a time-mode etch. It is important that there remains an opening 32 between the spacers 30. Controllable spacer oxide deposition and etchback is key to assuring that the opening 32 is of the desired width; that is, between about 100 to 300 Angstroms.

Figure 7:
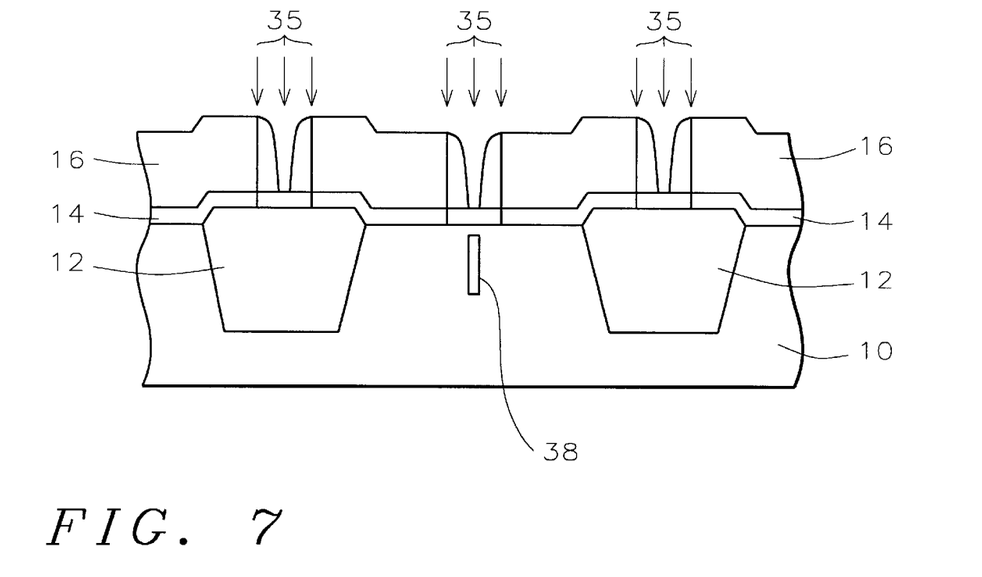

Now, a delta-channel implant is performed using the oxide spacers 30 as a mask. The delta-channel implant replaces a conventional pocket implant which typically has a dosage of between about 1E13 and 5E13 atoms/cm$^2$ as well as replacing a conventional anti-punch through implant. The delta-channel implant 35 implants In or Sb ions at a dosage of between about 1E14 and 5E15 atoms/cm$^2$ and an energy of between about 100 and 300 KeV. The delta-channel implanted region 38 is illustrated in FIG. 7.

Figure 8:
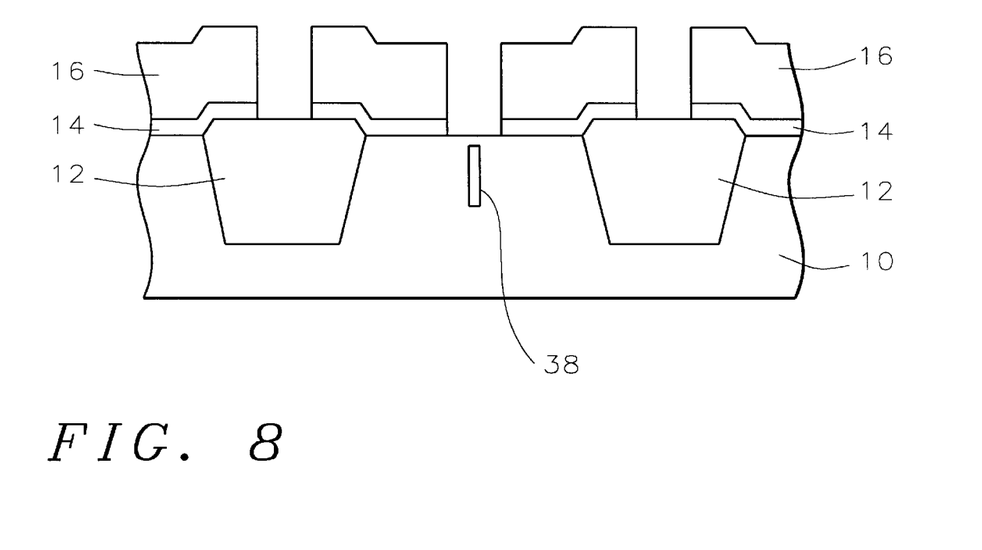

Now, the disposable oxide spacers 30 are removed by wet etching, for example, using dilute hydrofluoric acid, as shown in FIG. 8.

Figure 9:
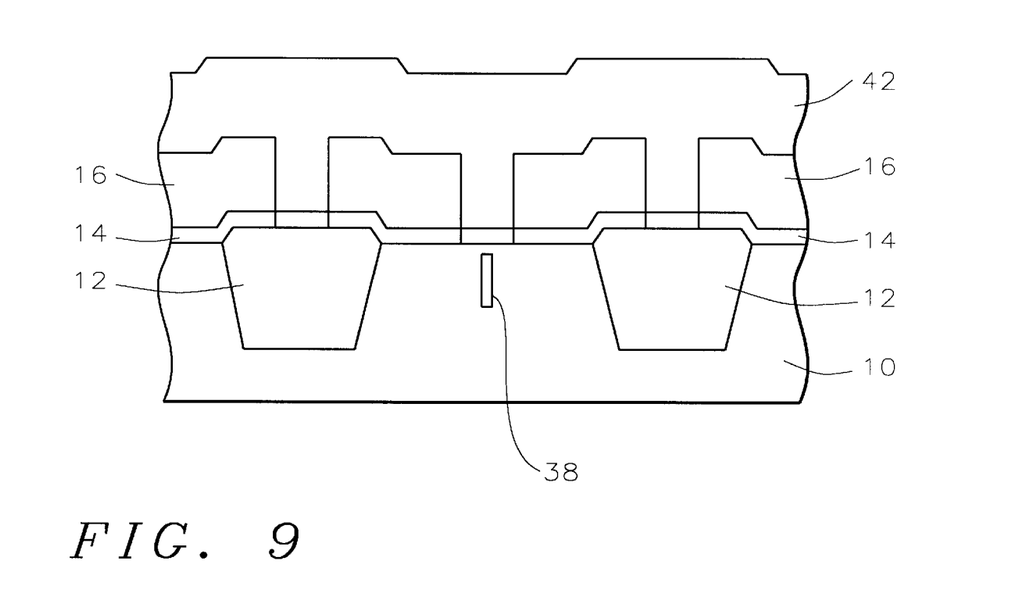

Referring now to FIG. 9, gate oxidation is again performed and polysilicon layer 42 is deposited by low pressure chemical vapor deposition (LPCVD) to a thickness of between about 1500 to 2500 Angstroms. The layer 16 can be doped in situ or doped after its deposition.

Figure 10:
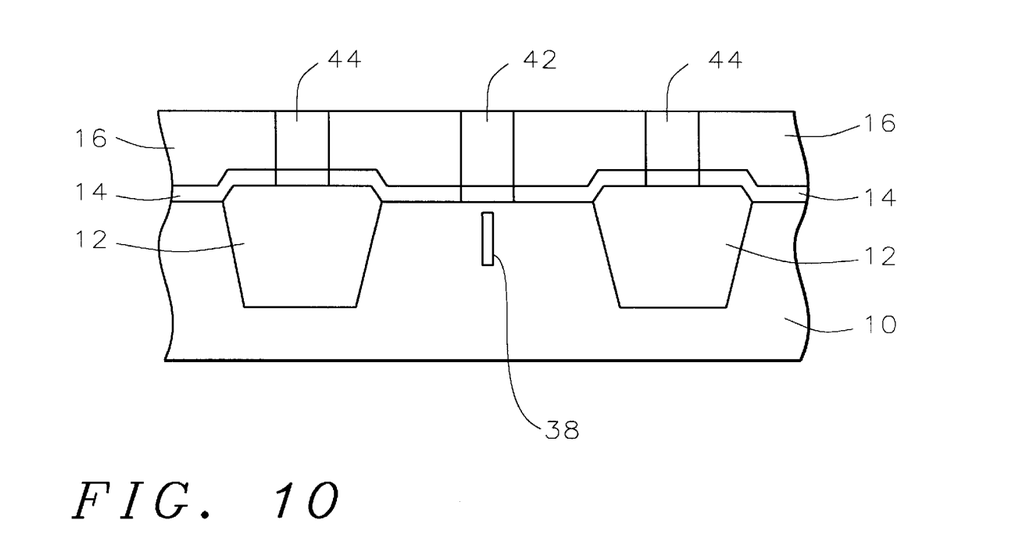
Figure 11:
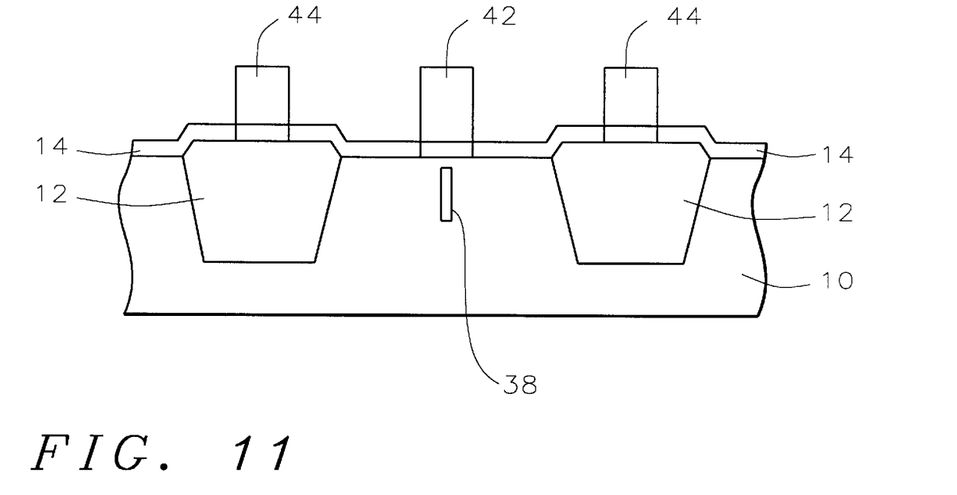

The polysilicon layer is polished using, for example, chemical mechanical polishing (CMP) to improve the topology of the substrate and to leave the polysilicon layer 42 only within the silicon nitride openings, as shown in FIG. 10. The silicon nitride layer 16 is removed, as shown in FIG. 11, completing formation of the self-aligned interconnection lines 44 and gate electrode 42 of the invention.

Figure 12:
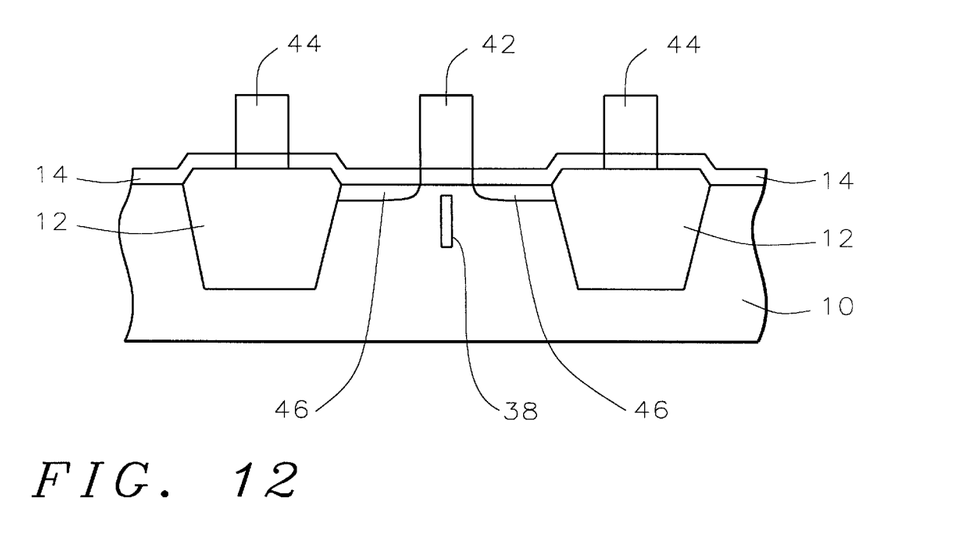

Now the LDD structure 46 of the MOS FET is formed by ion implantation. It is significant that the LDD implantation is through only the gate oxide layer 14 using the gate electrode 42 as a mask. Other methods implant through spacers. These methods require high energy and the junction depth is difficult to control causing a major manufacturing problem. LDD regions 46 are shown in FIG. 12.

Figure 13:
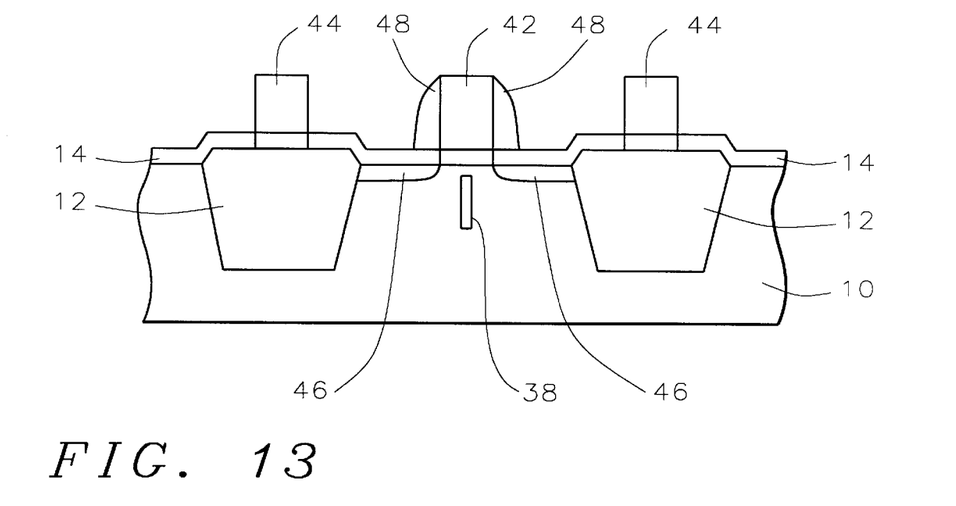
Figure 14:
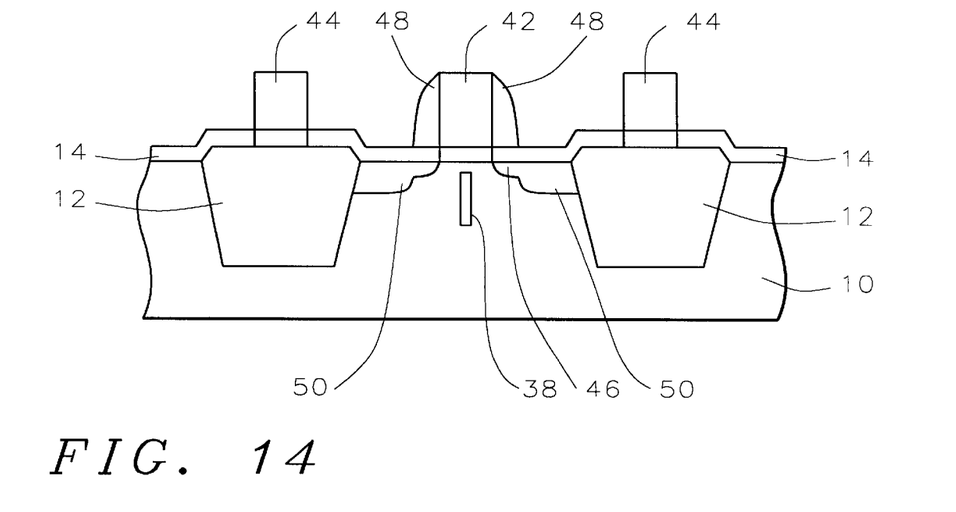

FIG. 13 illustrates spacers 48 formed on the sidewalls of the gate electrode 42 as is conventional in the art. Source/drain regions 50 are ion implanted into the substrate, as shown in FIG. 14, using the gate electrode and spacers as a mask. By controlling the implant energy of the source/drain implant, the drive current is improved and off leakage current inhibited.

In the conventional process, an anti-punch through implant is a blanket implant below the channel region. As a result, the high dosage below the source/drain region will induce higher parasitic capacitance. However, the delta-doped channel stop of the present invention is located at the center of the channel and not below the source/drain regions. Therefore, the parasitic junction capacitance will not be reduced.

Figure 15:
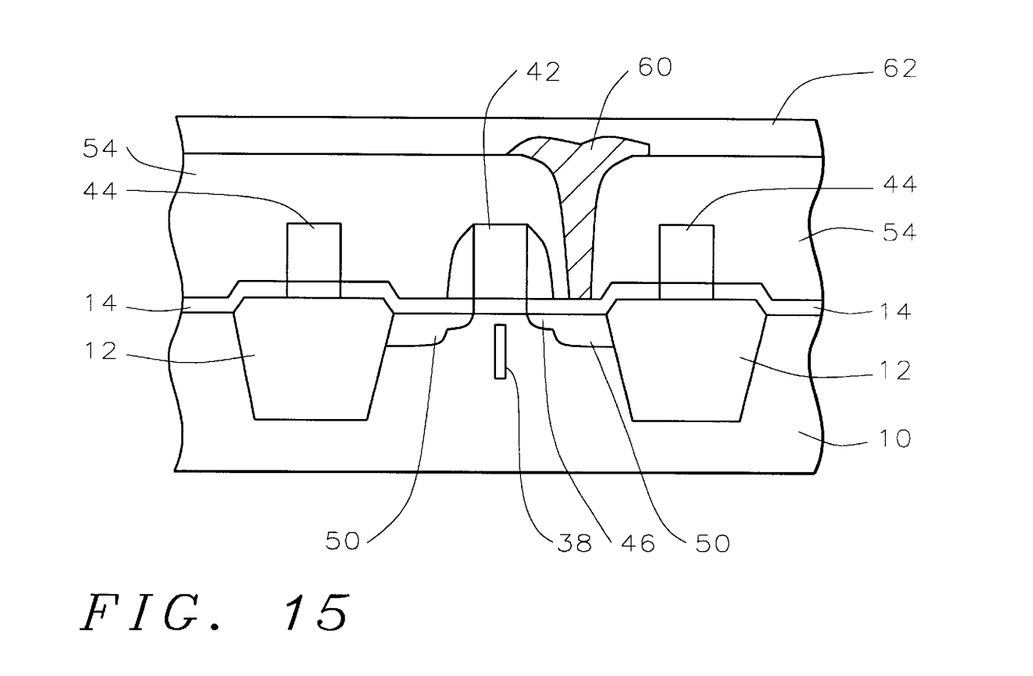
FIG. 15 schematically illustrates in cross-sectional representation a completed integrated circuit device fabricated according to the process of the present invention.

The integrated circuit device is completed as is conventional in the art. For example, as shown in FIG. 15, a thick insulating layer 54 is blanket deposited over the wafer's surfaces. Openings are etched through the insulating layer 54 to the underlying semiconductor device structures to be contacted, such as source/drain region 50. A metal layer 60 is deposited and patterned and then passivated with insulating layer 62. Higher level metallization, not shown, may be fabricated as required.

The process of the invention provides a method for suppressing short-channel effect without increasing junction leakage and capacitance using a single self-aligning delta-channel implant. Controllable deposition of the spacer film and controllable spacer etchback is used to control the delta-channel implant width and to assure that the implant will penetrate the substrate. As a result, the doping profile is predictable. This single implant suppresses short-channel effect without increasing junction capacitance and leakage.

While the invention has been particularly shown and described with reference to the preferred embodiments thereof, it will be understood by those skilled in the art that various changes in form and details may be made without departing from the spirit and scope of the invention.

What is claimed is:

1. A method of suppressing short channel effect using a single self-aligning delta-channel implant in the fabrication of an integrated circuit device comprising:

depositing a silicon nitride layer over a pad oxide layer overlying a semiconductor substrate;

patterning said silicon nitride layer and said pad oxide layer to leave an opening where a gate electrode will be formed;

forming dielectric spacers on the sidewalls of said opening wherein a portion of said semiconductor substrate not covered by said spacers within said opening corresponds to delta-channel implant width and wherein said width is between 100 and 300 Angstroms;

implanting said single self-aligning delta-channel implant into said semiconductor substrate using said silicon nitride layer and said dielectric spacers as a mask;

thereafter removing said dielectric spacers;

thereafter forming a gate oxide within the opening;

thereafter depositing a polysilicon layer over said silicon nitride layer and within said opening and polishing said polysilicon layer to leave said polysilicon layer only within said opening;

removing said silicon nitride layer to form said gate electrode wherein said delta-channel implant underlies said gate electrode; and thereafter forming lightly doped regions and source and drain regions within said semiconductor substrate associated with said gate electrode to complete said fabrication of said integrated circuit device.

2. The method according to claim 1 wherein said step of forming said dielectric spacers comprises:

conformally depositing an oxide layer over said silicon nitride layer and within said opening; and anisotropically etching back said oxide layer to form said dielectric spacers on the sidewalls of said opening.

3. The method according to claim 2 wherein said oxide layer comprises ozone-tetraethoxysilane (TEOS) deposited to a thickness of between about 7000 and 12,000 Angstroms.

4. The method according to claim 2 wherein said oxide layer comprises silicon oxide deposited by plasma-enhanced chemical vapor deposition to a thickness of between about 7000 and 12,000 Angstroms.

5. The method according to claim 2 wherein said step of anisotropically etching back said oxide layer uses a controllable time-mode etching.

6. The method according to claim 1 wherein said single delta-channel implant replaces both a conventional anti-punch through implant and a pocket implant.

7. The method according to claim 1 wherein said delta-channel implant comprises implanting In ions at a dosage of between about 1E14 and 5E15 atoms/cm$^2$ at an energy of between about 100 and 300 KeV.

8. The method according to claim 1 wherein said delta-channel implant comprises implanting Sb ions at a dosage of between about 1E14 and 5E15 atoms/cm$^2$ at an energy of between about 100 and 300 KeV.

9. The method according to claim 1 wherein said delta-channel implant suppresses said short-channel effect without increasing junction capacitance and junction leakage.

10. A method of suppressing short-channel effect using a single self-aligning delta-channel implant in the fabrication of an integrated circuit device comprising:

forming a pad oxide layer over a semiconductor substrate;

depositing a silicon nitride layer overlying said pad oxide layer and patterning said silicon nitride layer, said pad oxide layer to leave an opening where a gate electrode will be formed;

forming dielectric spacers on the sidewalls of said opening wherein a portion of said semiconductor substrate not covered by said spacers within said opening corresponds to delta-channel implant width and wherein said width is between 100 and 300 Angstroms;

implanting said single self-aligning delta-channel implant into said semiconductor substrate using said silicon nitride layer and said dielectric spacers as a mask whereby said delta-channel implant suppresses said short-channel effect without increasing junction capacitance and junction leakage;

thereafter removing said dielectric spacers;

thereafter forming a gate oxide within the opening;

thereafter depositing a polysilicon layer over said silicon nitride layer and within said opening and polishing said polysilicon layer to leave said polysilicon layer only within said opening;

removing said silicon nitride layer to form said gate electrode wherein said delta-channel implant underlies said gate electrode; and thereafter forming lightly doped regions and source and drain regions within said semiconductor substrate associated with said gate electrode to complete said fabrication of said integrated circuit device.

11. The method according to claim 10 wherein said step of forming dielectric spacers comprises:

conformally depositing an oxide layer over said silicon nitride layer and within said opening; and anisotropically etching back said oxide layer to form said dielectric spacers on the sidewalls of said opening.

12. The method according to claim 11 wherein said oxide layer comprises ozone-tetraethoxysilane (TEOS) deposited to a thickness of between about 7000 and 12,000 Angstroms.

13. The method according to claim 11 wherein said oxide layer comprises silicon oxide deposited by plasma-enhanced chemical vapor deposition to a thickness of between about 7000 and 12,000 Angstroms.

14. The method according to claim 11 wherein said step of anisotropically etching back said oxide layer uses a controllable time-mode etching.

15. The method according to claim 10 wherein said single delta-channel implant replaces both a conventional anti-punch through implant and a pocket implant.

16. The method according to claim 10 wherein said delta-channel implant comprises implanting one of the group containing In and Sb ions at a dosage of between about 1E14 and 5E15 atoms/cm$^2$ at an energy of between about 100 and 300 KeV.

17. A method of suppressing short-channel effect using a single self-aligning delta-channel implant in the fabrication of an integrated circuit device comprising:

forming a pad oxide layer over a semiconductor substrate;

depositing a silicon nitride layer overlying said pad oxide layer and patterning said silicon nitride layer, said pad oxide layer to leave an opening where a gate electrode will be formed;

conformally depositing an oxide layer over said silicon nitride layer and within said opening;

anisotropically etching back said oxide layer to form said dielectric spacers on the sidewalls of said opening wherein a portion of said semiconductor substrate not covered by said spacers within said opening corresponds to delta-channel implant width and wherein said width is between 100 and 300 Angstroms;

implanting said single self-aligning delta-channel implant into said semiconductor substrate using said silicon nitride layer and said dielectric spacers as a mask whereby said delta-channel implant suppresses said short channel effect without increasing junction capacitance and junction leakage;

thereafter removing said dielectric spacers;

thereafter forming a gate oxide within the opening;

thereafter depositing a polysilicon layer over said silicon nitride layer and within said opening and polishing said polysilicon layer to leave said polysilicon layer only within said opening;

removing said silicon nitride layer to form said gate electrode wherein said delta-channel implant underlies said gate electrode; and thereafter forming lightly doped regions and source and drain regions within said semiconductor substrate associated with said gate electrode to complete said fabrication of said integrated circuit device.

18. The method according to claim 17 wherein said oxide layer comprises ozone-tetraethoxysilane (TEOS) deposited to a thickness of between about 7000 and 12,000 Angstroms.

19. The method according to claim 17 wherein said oxide layer comprises silicon oxide deposited by plasma-enhanced chemical vapor deposition to a thickness of between about 7000 and 12,000 Angstroms.

20. The method according to claim 17 wherein said step of anisotropically etching back said oxide layer uses a controllable time-mode etching.

21. The method according to claim 17 wherein said single delta-channel implant replaces both a conventional anti-punch through implant and a pocket implant.

22. The method according to claim 17 wherein said delta-channel implant comprises implanting one of the group containing In and Sb ions at a dosage of between about 1E14 and 5E15 atoms/cm$^2$ at an energy of between about 100 and 300 KeV.

* * * * *